(12) United States Patent
Terayama

(10) Patent No.: US 7,330,067 B2
(45) Date of Patent: Feb. 12, 2008

(54) SEMICONDUCTOR APPARATUS

(75) Inventor: Kazuyoshi Terayama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 178 days.

(21) Appl. No.: 11/339,799

(22) Filed: Jan. 26, 2006

(65) Prior Publication Data
US 2006/0238236 A1 Oct. 26, 2006

(30) Foreign Application Priority Data
Feb. 2, 2005 (JP) ............................. 2005-026171

(51) Int. Cl.
*G05F 1/10* (2006.01)
(52) U.S. Cl. ...................... 327/544; 327/309
(58) Field of Classification Search ................ 327/309, 327/310, 318, 319, 333, 544
See application file for complete search history.

(56) References Cited
U.S. PATENT DOCUMENTS

| | | | |
|---|---|---|---|
| 6,717,460 B2 | 4/2004 | Yamauchi et al. | |
| 6,741,114 B2 * | 5/2004 | Kim | 327/310 |
| 6,757,147 B1 * | 6/2004 | Tong et al. | 361/111 |
| 6,850,453 B2 | 2/2005 | Park | |
| 6,917,554 B2 * | 7/2005 | Annavajjhala | 365/226 |

FOREIGN PATENT DOCUMENTS

| | | |
|---|---|---|
| JP | 2003-133935 A | 5/2003 |
| JP | 2004-039205 A | 2/2004 |

* cited by examiner

*Primary Examiner*—Jeffrey Zweizig
(74) *Attorney, Agent, or Firm*—Foley & Lardner LLP

(57) ABSTRACT

Disclosed is a semiconductor apparatus adapted to reduce the inflow of current from an external input terminal in a power saving mode. A mode decision circuit 11 outputs to an interruption circuit 10 and a floating prohibiting circuit 15 a mode signal indicating whether operation of the semiconductor apparatus is power saving mode or regular operating mode. When the mode signal indicates the power saving mode, the interruption circuit 10 is rendered non-conductive to disconnect an external input terminal 13 on one hand and an input capacitance adjustment capacitor 12 and an initial stage input circuit 14 on the other hand from each other. The floating prohibiting circuit 15 also sets the voltage at an input end of the initial stage input circuit 14 at a preset voltage level. When the mode signal indicates the regular operating mode, the interruption circuit 10 is rendered conductive, such that the input capacitance adjustment capacitor 12 and the initial stage input circuit 14 are connected via a static charge breakdown prohibiting resistor device 21 to the external input terminal 13 to transmit an input signal of the external input terminal 13 to the initial stage input circuit 14.

11 Claims, 5 Drawing Sheets

FIG . 5        PRIOR ART
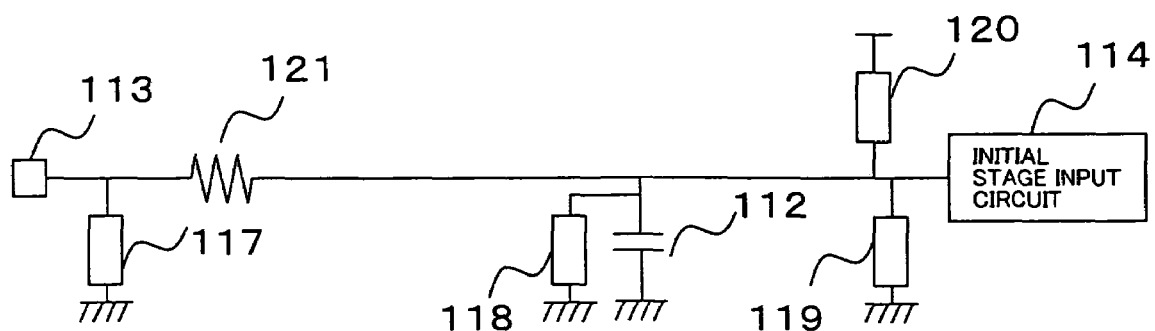

SEMICONDUCTOR APPARATUS

FIELD OF THE INVENTION

This invention relates to a semiconductor apparatus and, more particularly, to a semiconductor apparatus operating with a low power mode.

BACKGROUND OF THE INVENTION

Recently, as the market for mobile phones is increasing, there is an increasing demand for the semiconductor for mobile devices, termed a random access memory for mobile equipment (referred to below as "mobile RAM"). In general, the mobile RAM is routinely presented as a multi-chip package (MCP) along with an application CPU or a flash memory.

As one of the characteristics of the mobile RAM, it has low power characteristics superior to the routine RAM. As an example, the mobile RAM has a low power mode, termed a deep power down mode (see, for example, the Patent Publications 1 and 2). When the operating mode of the mobile RAM enters the deep power down mode, the mobile RAM substantially interrupts the power supply line within the RAM to lower the power consumption in the RAM to a lowermost value possible. In actuality, only an initial-stage input circuit and a portion of the power supply circuit are in operation, while the RAM information is not retained, with the current consumption being 10 µA or less.

An input unit in this mobile RAM will now be explained. FIG. 5 depicts a block diagram of an input section in a conventional mobile RAM. The input section in the mobile RAM includes an external input terminal 113, an input capacitance adjustment capacitor 112, an initial stage input circuit 114, static charge breakdown prohibiting semiconductor devices 117 to 120, and a static charge breakdown prohibiting resistor device 121. In this input section, signals entered to the external input terminal 113 are entered to the initial stage input circuit 114 via resistor device 121. The elector-static noise, applied to the external input terminal 113, is attenuated in the semiconductor devices 117 to 120 and in the resistor device 121, so as not to damage the initial stage input circuit 114 or the input capacitance adjustment capacitor 112. The semiconductor devices 117 to 120 are made up e.g. by diodes or MOS transistors, and operate for becoming conductive upon incoming of a signal in excess of a preset voltage level, to conduct the current to the ground.

Meanwhile, e.g., the semiconductor devices 117 to 120 and the static charge breakdown prohibiting resistor device 121 possess non-negligible capacitances. By and large, the capacitance value of an input terminal of a semiconductor IC is prescribed at relevant electrical rating values. Hence, the input capacitance adjustment capacitor 112 for confining the input terminal capacitance within the range of prescribed values is added to the input terminal, under the assumption that departure from design capacitance values may possibly arise due, e.g., to process variations occurring in the course of manufacture. With a double data rate synchronous DRAM (DDR SDRAM), for example, the prescriptions for the input terminal capacitances are 2.5 pF to 3.5 pF. Thus, a plurality of the input capacitance adjustment capacitors 112, the input capacitance values of which can be adjusted at steps of the order of 0.1 pF, are connected across an input end of the initial stage input circuit 114 and the ground. There is provided a built-in structure for adjusting the capacitance by selecting and connecting plural capacitors by, e.g., switching the interconnections. The input capacitance adjustment capacitors 112 are each arranged so that the total capacitance thereof will amount to approximately 0.5 pF to 1 pF.

[Patent Publication 1] JP Patent Kokai Publication No. JP-P2003-133935A (FIGS. 1 and 2)

[Patent Publication 2] JP Patent Kokai Publication No. JP-P2004-39205A (FIG. 1)

SUMMARY OF THE DISCLOSURE

If, in a conventional mobile RAM, the mobile RAM side has entered a power saving mode, and a clock signal is supplied to an external input pin for an address signal, an alternating-fashioned current flows through the input capacitance adjustment capacitor 112 to, e.g., the ground (GND). It is to be noted that, in the power saving mode, the mobile RAM is not in operation, so that the clock signal is a meaningless signal. If this current is simulated in terms of a simplified RC circuit, the effective current as high as approximately 1.12 mA flows under the conditions of a resistance value R=200Ω, an input capacitance C=1 pF, a clock signal frequency f=100 MHz and a power supply voltage V=1.8 V. Such a consumed current which is large as this flows through the mobile RAM despite the fact that the consumed current is suppressed to 10 µA or less in the mobile RAM. This current represents wasteful power consumption for the entire system and may give rise to decreased use time for the battery.

It is an object of the present invention to provide a semiconductor apparatus for decreasing the current inflow from an external input terminal in case where the power saving mode prevails.

According to an aspect of the present invention, there is provided a semiconductor apparatus comprising an external input terminal, an input capacitance adjustment capacitor that adds a capacitance to the external input terminal, a mode decision circuit that outputs a mode signal indicating whether the operation of the semiconductor apparatus is a power saving mode or a regular operation mode, an interruption circuit interposed between the external input terminal and the input capacitance adjustment capacitor, with the interruption circuit being supplied with the mode signal and being rendered non-conductive and conductive when the mode signal indicates the power saving mode and the regular operation mode, respectively, and an initial stage input circuit connected to the external input terminal at least in case where the semiconductor apparatus operation is at the regular operation mode.

Preferably, in a first phase of the semiconductor apparatus, the external input terminal is connected to one end of the interruption circuit of the semiconductor apparatus, and the input capacitance adjustment capacitor and the initial stage input circuit are connected to the other end of the interruption circuit. The external input terminal and the input capacitance adjustment capacitor on one hand and the initial stage input circuit on the other are isolated from each other by the interruption circuit in case the mode signal indicates the power saving mode. The external input terminal and the input capacitance adjustment capacitor on one hand and the initial stage input circuit on the other are rendered conductive by the interruption circuit in case the mode signal indicates the regular operating mode.

Preferably, in a second phase of the semiconductor apparatus, there is further provided a floating prohibiting circuit for setting the voltage of an input end of the initial stage input circuit at a preset voltage level in case the power saving mode prevails.

Preferably, in a third phase of the semiconductor apparatus, a static charge breakdown prohibiting resistor device is interposed between one end of the interruption circuit and the external input terminal.

Preferably, in a fourth phase of the semiconductor apparatus, the external input terminal and the initial stage input circuit are connected to one end of the interruption circuit, and the input capacitance adjustment capacitor is connected to the other end (opposite end) of the interruption circuit. Preferably, the external input terminal and the input capacitance adjustment capacitor are isolated from each other by the interruption circuit in case the mode signal indicates the power saving mode. Also, the external input terminal and the input capacitance adjustment capacitor are rendered conductive by the interruption circuit in case the mode signal indicates the regular operating mode.

Preferably, in a fifth phase of the semiconductor apparatus, the external input terminal, to which the interruption circuit is connected, is an input terminal different from the input terminal supplied with the information needed for operation of restoration from the power saving mode to the regular operating mode.

Preferably, in a sixth phase of the semiconductor apparatus, the interruption circuit in a conducting state has a resistance value not larger than 1 kΩ.

Preferably, in a seventh phase of the semiconductor apparatus, the interruption circuit is a switching circuit formed by a MOS transistor, and the mode signal is sent to a control terminal of the MOS transistor.

Preferably, in an eighth phase of the semiconductor apparatus, the interruption circuit is a switching circuit formed by a transfer gate, and the mode signal is supplied to a control terminal of the transfer gate.

The meritorious effects of the present invention are summarized as follows.

According to the present invention, the current path across the external input terminal and the input capacitance adjustment capacitor is interrupted in the power saving mode by the interruption circuit, so that, even though A.C. signals, such as clock signal, are supplied to the external input terminal, it becomes possible to suppress consumption of unneeded current ascribable to capacitance coupling.

BRIEF DESCRIPTIONS OF THE DRAWINGS

FIG. 5 is a block diagram showing an input section of a conventional semiconductor apparatus.

PREFERRED EMBODIMENTS OF THE INVENTION

Figure 1:
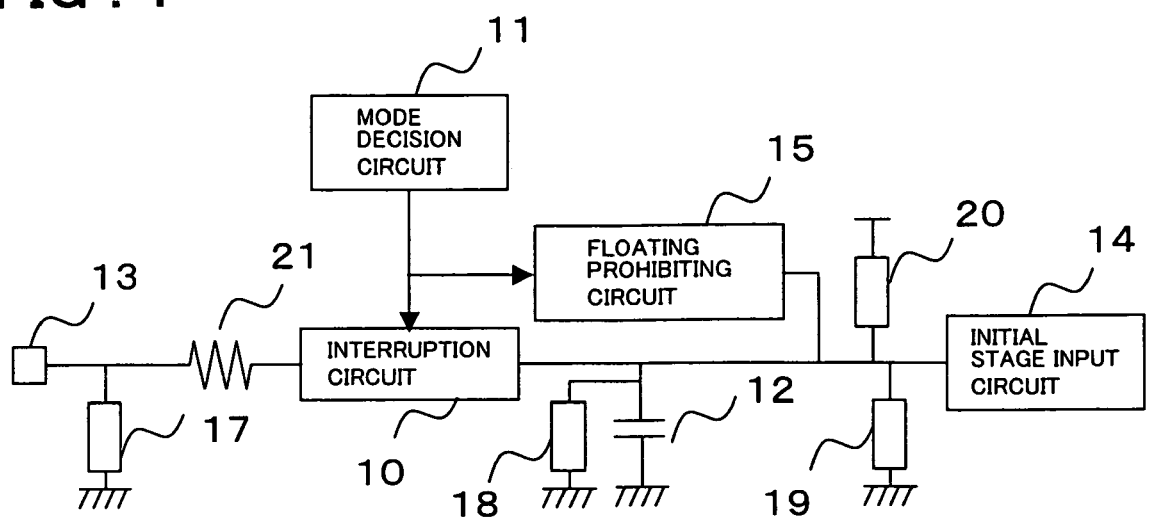
FIG. 1 is a block diagram showing essential components of a semiconductor apparatus according to a first embodiment of the present invention.

In an embodiment of the semiconductor apparatus of the present invention, there is provided an interruption circuit (10 of FIG. 1) which interrupts signals from the external input terminal (pin) (13 of FIG. 1) to an input capacitance adjustment capacitor (12 of FIG. 1) when a mode decision circuit (11 of FIG. 1) has detected that the power saving mode has been entered. The mode decision circuit sends to the interruption circuit a control signal having bi-valued voltage levels changing between transition to the power saving mode and restoration to the regular operation mode. The interruption circuit is interposed between the external input terminal on one hand and the input capacitance adjustment capacitor and the initial stage input circuit (14 of FIG. 1) on the other, and is rendered non-conductive and conductive when the control signal indicates the power saving mode and the regular operating mode, respectively.

With the above-described semiconductor apparatus, in case the control signal indicates the power saving mode, current inflow from the external input terminal to the input capacitance adjustment capacitor is interrupted to suppress wasteful power consumption from increasing. Referring to the drawings, preferred embodiments of the present invention will be explained in detail.

First Embodiment

FIG. 1 depicts a block diagram showing an input section of a semiconductor apparatus according to a first embodiment of the present invention. In FIG. 1, the input section includes an interruption circuit 10, a mode decision circuit 11, an input capacitance adjustment capacitor 12, an external input terminal 13, an initial stage input circuit 14, a floating prohibiting circuit 15, static charge breakdown prohibiting semiconductor devices 17 to 20, and a static charge breakdown prohibiting resistor 21. The external input terminal 13, initial stage input circuit 14, static charge breakdown prohibiting semiconductor devices 17 to 20 and the static charge breakdown prohibiting resistor device 21 are equivalent to the external input terminal 113, initial stage input circuit 114, static charge breakdown prohibiting semiconductor devices 117 to 120 and to the static charge breakdown prohibiting resistor device 121, respectively, and hence the corresponding description is dispensed with. The external input terminal 13 is connected to one end of the semiconductor device 17 and to one end of the resistor device 21. The other end of the semiconductor device 17 is grounded. The other end of the resistor device 21 is connected to one end of the interruption circuit 10, the other end of which interruption circuit 10 is connected to one ends of the semiconductor device 18, input capacitance adjustment capacitor 12, semiconductor device 19 and, semiconductor device 20, and to an input end of the initial stage input circuit 14. The opposite sides of the semiconductor device 18, input capacitance adjustment capacitor 12 and the semiconductor device 19 are grounded, while the opposite side of the semiconductor device 20 is connected to a power supply. An output of the mode decision circuit 11 is supplied to the interruption circuit 10 and to the floating prohibiting circuit 15, and an output of the floating prohibiting circuit 15 is connected to an input end of the initial stage input circuit 14.

In the above-described inputting section, the mode decision circuit 11 outputs to the interruption circuit 10 a control signal which controls whether the interruption circuit 10 to be turned off or turned on depending on whether the semiconductor apparatus is in a power saving mode or in a usual operating mode. That is, the mode decision circuit 11 outputs, to the interruption circuit 10, a control signal which is changed over between two voltage levels by transition to the power saving mode and by restoration to the usual mode. The interruption circuit 10 includes a switching device formed by an active device, such as a MOS transistor, and carries out switch-on or switch-off operations, in dependence upon whether the prevailing mode is the usual mode or the power saving mode, respectively, based on a control signal. With the power saving mode, the supply of power to the major portions of internal circuits of the semiconductor apparatus, not shown, is interrupted, and hence the power consumption is suppressed to an extremely small value.

When the semiconductor apparatus is in the power saving mode, the floating prohibiting circuit 15 sets an input end of the initial stage input circuit 14 at a fixed voltage level, in order to avoid the floating of the input end of the initial stage input circuit 14. For example, the floating prohibiting circuit provides for a high level (power supply potential) or a low level (grounding potential) of the input level of the initial stage input circuit 14. If the gate input state of the initial stage input circuit 14 becomes the gate floating state, by the interruption circuit 10, the input gate level becomes 'indefinite', that is, the input gate level being a high level or a low level becomes indeterminate, thus giving rise to an inconvenience that the tunneling current flows from the power supply of the initial stage input circuit 14 to the ground (GND). With the use of the floating prohibiting circuit 15, it becomes possible to prevent this from occurring.

Meanwhile, the interruption circuit 10 is desirably placed at a location as close to the external input terminal 13 as possible. By arranging the interruption circuit at a location closer to the external input terminal 13, the effective static capacitance in the external input terminal 13, ascribable to, e.g., interconnections, may be reduced to a smaller value, which is effective in further reducing the current inflow from the external output terminal.

By the above configuration, it becomes possible to suppress approximately 40% at the maximum of the effects of the input terminal capacitance, in case where the capacitance of the input capacitance adjustment capacitor 12 is 1 pF against the total input capacitance of 2.5 pF.

The interruption circuit 10, considered as an electrical circuit, has a finite resistance, even when the interruption circuit is in an on-state. Hence, the resistance value of the resistor device 21 for preventing static charge breakdown may be reduced by the interruption circuit 10 taking over part of the resistance of the static charge breakdown prohibiting resistor device 21.

It is moreover desirable that the interruption circuit 10 has a resistance value not larger than 1 kΩ even when the circuit is in a conducting state. The reason is that, if the resistance value in the conducting state exceeds 1 kΩ, the effect of the capacitance of the input capacitance adjustment capacitor 12, when looking from the external input terminal 13, becomes weaker, with the result that capacitance prescriptions at the input terminal cannot effectively be satisfied.

It is moreover desirable that the external input terminal 13, to which the interruption circuit 10 is connected, is an external input pin different from the external input terminal needed for carrying out the operation for restoration from the power saving mode. The reason is that, if the interruption circuit 10 is connected to the external input terminal set for carrying out the operation for restoration, the input circuit is in an interrupted state, in the power saving mode, with the result that the input circuit becomes unable to allow to receive a signal needed for the restoration operation from outside.

Figure 2:
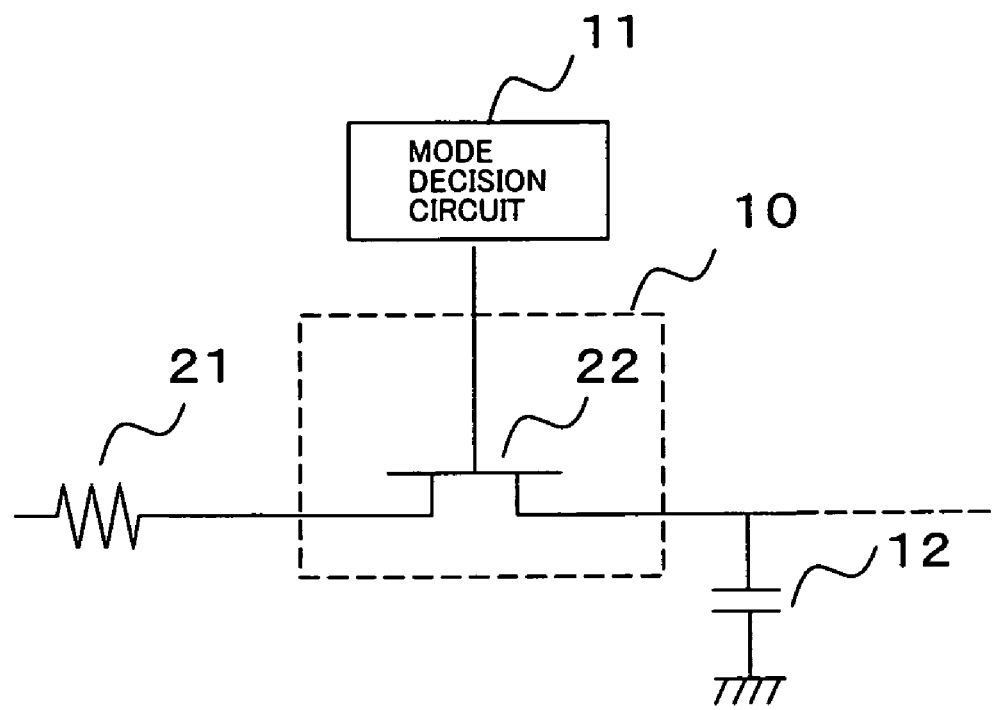
FIG. 2 is a circuit diagram showing an illustrative structure of an interruption circuit.

The specified circuit configuration of the interruption circuit 10 will now be explained. FIG. 2 depicts a circuit diagram showing an illustrative structure of the interruption circuit 10. The interruption circuit 10 of FIG. 2 is of the simplest configuration composed solely of an NMOS transistor 22. This NMOS transistor 22 has one end and the other end connected to the resistor device 21 and to the input capacitance adjustment capacitor 12, respectively, while having a control end (gate) connected to an output of the mode decision circuit 11.

When a command for transfer to the power saving mode is executed, a control signal, output by the mode decision circuit 11, is supplied to the control end of the NMOS transistor 22. If assumed that the control signal, entered at this time, is at a low level (GND level), the NMOS transistor 22 is turned off. Hence, the signal to be afforded from outside to the external input terminal 13 is interrupted thereat, thus eliminating signal inflow to the input capacitance adjustment capacitor 12.

If the command for restoration to the usual mode is executed, the control signal, output from the mode decision circuit 11, is inverted to a high level (power supply level). The NMOS transistor 22 is then turned on to transmit the signal from the external input terminal 13 to the initial stage input circuit 14 via NMOS transistor 22 to enable the regular operation. Simultaneously, the capacitance of the input capacitance adjustment capacitor 12 may now be seen from the external input terminal 13 to satisfy the capacitance prescriptions at the external input terminal 13.

Figure 3:
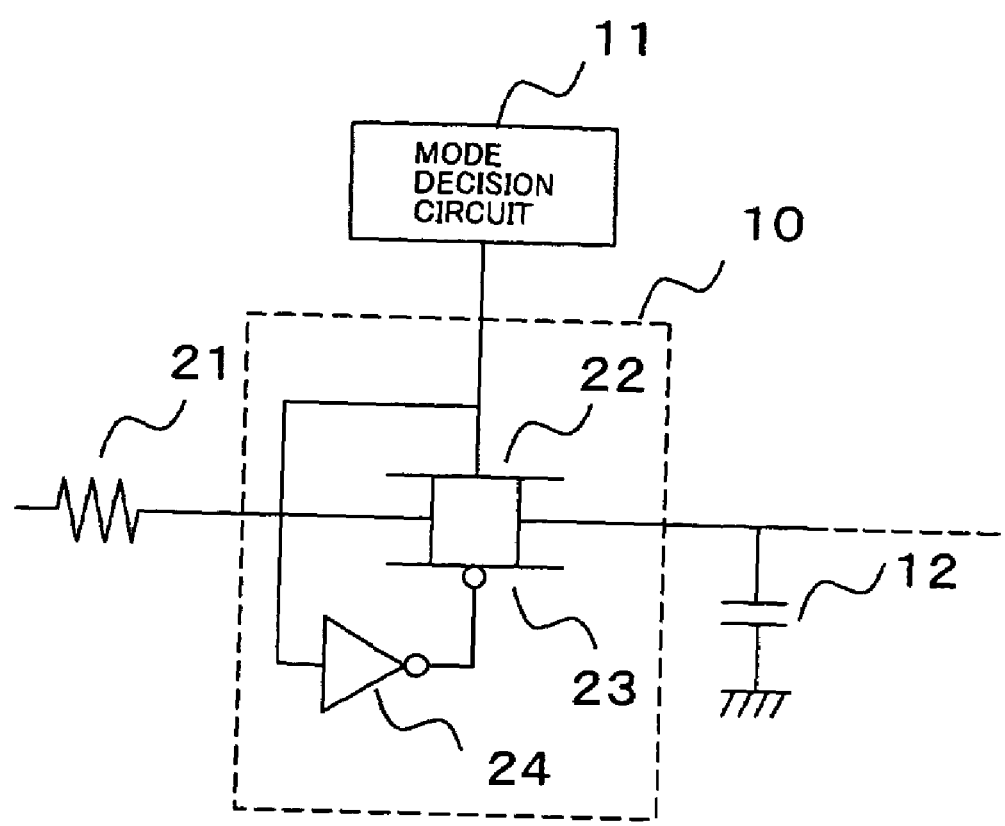
FIG. 3 is a circuit diagram showing another illustrative structure of the interruption circuit.

FIG. 3 depicts a circuit diagram showing a modified illustrative structure of the interruption circuit 10. An interruption circuit 10 of FIG. 3 is made up of an NMOS transistor 22, a PMOS transistor 23 and an inverter (inverting amplifier) 24. The one ends of the NMOS transistor 22 and the PMOS transistor 23 are in common and connected to a resistor device 21, whilst the other ends thereof are in common and connected to, for example, the input capacitance adjustment capacitor 12. An output of the mode decision circuit 11 is connected to a control node (gate) of the NMOS transistor 22, while being connected via inverter (inverting amplifier) 24 to the control node (gate) of the PMOS transistor 23. That is, the NMOS transistor 22 and the PMOS transistor 23 form a transfer gate which may be opened/closed by a control signal of the mode decision circuit 11.

When a command for transfer to the power saving mode is executed, a control signal, output by the mode decision circuit 11, is supplied to the control node of the NMOS transistor 22 and to an input node of the inverter 24. If assumed that the control signal, entered at this time, is at a low level (GND level), the NMOS transistor 22 and the PMOS transistor 23 are turned off. Hence, the signal to be afforded from outside to the external input terminal 13 is interrupted thereat, thus eliminating signal inflow to the input capacitance adjustment capacitor 12.

When the command for transfer to the power saving mode is executed, the control signal, output from the mode decision circuit 11, is inverted to a high level (power supply level). The NMOS transistor 22 and the PMOS transistor 23 are then turned on to transmit the signal from the external input terminal 13 to the initial stage input circuit 14 via NMOS transistor 22 and PMOS transistor 23 to enable the regular operation. Simultaneously, the capacitance of the input capacitance adjustment capacitor 12 may be seen from the external input terminal 13 to satisfy the capacitance prescriptions at the external input terminal 13.

In case the interruption circuit 10 is formed solely by the NMOS transistor 22 of FIG. 2, it is necessary to set a corrected voltage level corresponding to addition of a voltage corresponding to a threshold voltage (Vt) of the NMOS transistor. On the other hand, if the interruption circuit 10 shown in FIG. 3 is used, the above-described special voltage correction is unnecessary.

Second Embodiment

Figure 4:
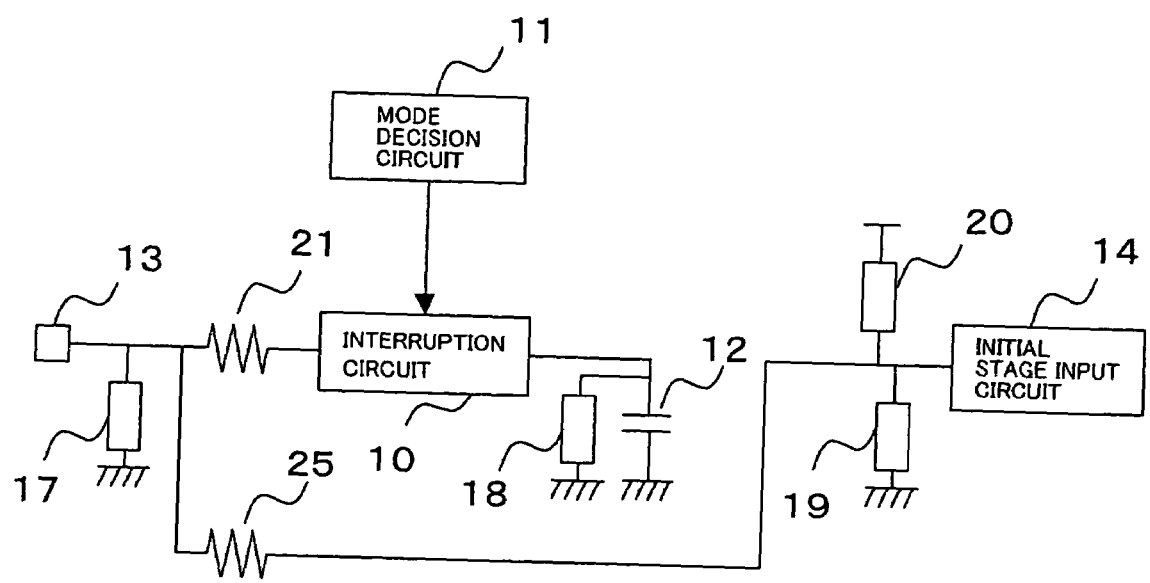
FIG. 4 is a block diagram showing essential components of the semiconductor apparatus according to a second embodiment of the present invention.

FIG. 4 depicts a block diagram showing an input section of a semiconductor apparatus according to a second embodiment of the present invention. Referring to FIG. 4, the input section includes an interruption circuit 10, a mode decision circuit 11, an input capacitance adjustment capacitor 12, an external input terminal 13, an initial stage input circuit 14, static charge breakdown prohibiting semiconductor devices 17 to 20, and static charge breakdown prohibiting resistor devices 21 and 25. In FIG. 4, the same reference numerals as those of FIG. 1 represent the same parts or components and the description therefor is dispensed with. The present embodiment differs from the embodiment of FIG. 1 in that, in the input section of the semiconductor apparatus, shown in FIG. 4, the initial stage input circuit 14 and the semiconductor devices 19, 20 are connected via resistor device 25 to the external input terminal 13. The floating prohibiting circuit 15 is not provided.

In the configuration of FIG. 4, the input at the external input terminal 13 is transmitted on two routes, namely a route through the interruption circuit 10 and an other route through the initial stage input circuit 14. As in the configuration shown in FIG. 1, since the control signal output from the mode decision circuit 11 is sent to the interruption circuit 10, the interruption circuit 10 interrupts the input to the input capacitance adjustment capacitor 12 when the low power mode is entered. On the other hand, the input signal from the external input terminal 13 is transmitted to the gate of the initial stage input circuit 14, without relevance to the prevailing mode, and hence the problem of gate floating may be eliminated. That is, since the input from the external input terminal 13 to the input capacitance adjustment capacitor 12 is isolated, there is derived an advantage that the floating prohibiting circuit 15 of FIG. 1 is unneeded.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor apparatus comprising:
    an external input terminal;
    an input capacitance adjustment capacitor that adds a capacitance to said external input terminal;
    a mode decision circuit that outputs a mode signal indicating whether the operation of the semiconductor apparatus is a power saving mode or a regular operation mode;
    an interruption circuit interposed between said external input terminal and said input capacitance adjustment capacitor, said interruption circuit being supplied with said mode signal and rendered non-conductive and conductive when said mode signal indicates the power saving mode and the regular operation mode, respectively; and
    an initial stage input circuit connected to said external input terminal at least in case where the semiconductor apparatus operation is at the regular operation mode.

2. The semiconductor apparatus as defined in claim 1, wherein
    said external input terminal is connected to one end of said interruption circuit; said input capacitance adjustment capacitor and said initial stage input circuit are connected to the other end of said interruption circuit;
    said external input terminal and said input capacitance adjustment capacitor on one hand and said initial stage input circuit on the other are (i) isolated from each other, or (ii) rendered conductive, by said interruption circuit in case where said mode signal indicates (i) the power saving mode, or (ii) the regular operating mode, respectively.

3. The semiconductor apparatus as defined in claim 2 further comprising:
    a floating prohibiting circuit that sets the voltage of an input end of said initial stage input circuit at a preset voltage level in case the power saving mode prevails.

4. The semiconductor apparatus as defined in claim 1 further comprising:
    a static charge breakdown prohibiting resistor device interposed between one end of said interruption circuit and said external input terminal.

5. The semiconductor apparatus as defined in claim 1, wherein
    said external input terminal and said initial stage input circuit are connected to one end of said interruption circuit; said input capacitance adjustment capacitor is connected to the other end of said interruption circuit;
    said external input terminal and said input capacitance adjustment capacitor are (i) isolated from each other, or (ii) rendered conductive, by said interruption circuit in case where said mode signal indicates (i) said power saving mode, or (ii) said regular operating mode, respectively.

6. The semiconductor apparatus as defined in claim 1 wherein
    said external input terminal, to which said interruption circuit is connected, is an input terminal different from the input terminal supplied with the information needed for the operation of restoration from said power saving mode to said regular operating mode.

7. The semiconductor apparatus as defined in claim 1 wherein
    said interruption circuit in a conducting state has a resistance value not larger than 1 kΩ.

8. The semiconductor apparatus as defined in claim 1 wherein
    said interruption circuit is a switching circuit formed by a MOS transistor and wherein said mode signal is sent to a control terminal of said MOS transistor.

9. The semiconductor apparatus as defined in claim 7 wherein
    said interruption circuit is a switching circuit formed by a MOS transistor and wherein said mode signal is sent to a control terminal of said MOS transistor.

10. The semiconductor apparatus as defined in claim 1 wherein
    said interruption circuit is a switching circuit formed by a transfer gate and wherein said mode signal is supplied to a control terminal of said transfer gate.

11. The semiconductor apparatus as defined in claim 7 wherein
    said interruption circuit is a switching circuit formed by a transfer gate and wherein said mode signal is supplied to a control terminal of said transfer gate.

* * * * *